United States Patent
Leonard et al.

(10) Patent No.: US 8,980,445 B2
(45) Date of Patent: Mar. 17, 2015

(54) ONE HUNDRED MILLIMETER SIC CRYSTAL GROWN ON OFF-AXIS SEED

(75) Inventors: Robert T. Leonard, Raleigh, NC (US); Mark Brady, Carrboro, NC (US); Adrian Powell, Cary, NC (US)

(73) Assignee: Cree, Inc., Durham, NC (US)

( * ) Notice: Subject to any disclaimer, the term of this patent is extended or adjusted under 35 U.S.C. 154(b) by 1294 days.

(21) Appl. No.: 11/428,954

(22) Filed: Jul. 6, 2006

(65) Prior Publication Data

US 2008/0008641 A1 Jan. 10, 2008

(51) Int. Cl.
| | | |
|---|---|---|
| *C01B 31/36* | (2006.01) | |
| *B32B 9/00* | (2006.01) | |
| *B32B 19/00* | (2006.01) | |
| *C30B 29/36* | (2006.01) | |
| *C30B 23/00* | (2006.01) | |

(52) U.S. Cl.
CPC ............. *C30B 29/36* (2013.01); *C30B 23/00* (2013.01)
USPC ........... 428/698; 423/345; 428/220; 428/697; 428/699

(58) Field of Classification Search
USPC .................. 423/345; 428/220, 697, 698, 699
See application file for complete search history.

(56) References Cited

U.S. PATENT DOCUMENTS

| | | | |
|---|---|---|---|
| 4,866,005 A | 9/1989 | Davis et al. | |
| 4,912,064 A | 3/1990 | Kong et al. | |
| 4,918,497 A | 4/1990 | Edmond | |
| 5,248,385 A * | 9/1993 | Powell | 438/507 |
| RE34,861 E | 2/1995 | Davis et al. | |
| 5,592,501 A | 1/1997 | Edmond et al. | |
| 5,769,941 A * | 6/1998 | Chiou | 117/2 |
| 5,958,132 A | 9/1999 | Takahashi et al. | |
| 6,316,793 B1 | 11/2001 | Sheppard et al. | |
| 6,723,166 B2 | 4/2004 | Kuhn et al. | |
| 2002/0014199 A1 | 2/2002 | Kuhn et al. | |
| 2004/0187766 A1 | 9/2004 | Letertre | |
| 2005/0126471 A1 * | 6/2005 | Jenny et al. | 117/92 |
| 2005/0208687 A1 * | 9/2005 | Kasai et al. | 438/22 |
| 2005/0211156 A1 * | 9/2005 | Gunjishima et al. | 117/2 |
| 2006/0011128 A1 * | 1/2006 | Ellison et al. | 117/84 |

(Continued)

FOREIGN PATENT DOCUMENTS

| | | |
|---|---|---|
| EP | 1233085 | 8/2002 |
| EP | 1619276 | 1/2006 |

(Continued)

OTHER PUBLICATIONS

Machine English Translation of JP2004323348 provided by the JPO website. Internet Retrieval Date of Apr. 21, 2009.*

(Continued)

*Primary Examiner* — Jonathan Langman
(74) *Attorney, Agent, or Firm* — Steven B. Phillips; Moore & Van Allen PLLC

(57) ABSTRACT

A semiconductor crystal and associated growth method are disclosed. The crystal includes a seed portion and a growth portion on the seed portion. The seed portion and the growth portion form a substantially right cylindrical single crystal of silicon carbide. A seed face defines an interface between the growth portion and the seed portion, with the seed face being substantially parallel to the bases of the right cylindrical crystal and being off-axis with respect to a basal plane of the single crystal. The growth portion replicates the polytype of the seed portion and the growth portion has a diameter of at least about 100 mm.

11 Claims, 5 Drawing Sheets

(56) References Cited

U.S. PATENT DOCUMENTS

| | | | |
|---|---|---|---|
| 2006/0032434 A1 | 2/2006 | Mueller et al. | |
| 2006/0073707 A1 | 4/2006 | Powell et al. | |
| 2006/0174820 A1* | 8/2006 | Yoshizawa | 117/13 |
| 2007/0209577 A1* | 9/2007 | Powell et al. | 117/87 |

FOREIGN PATENT DOCUMENTS

| | | | | |
|---|---|---|---|---|
| JP | 04016597 | | 1/1992 | |
| JP | 8245299 | A | 9/1996 | |
| JP | 10022526 | A | 1/1998 | |
| JP | 2000340512 | A | 12/2000 | |
| JP | 2004099340 | A | 4/2004 | |
| JP | 2004-323348 | * | 11/2004 | C30B 29/38 |
| JP | WO/2005/007940 | * | 1/2005 | C30B 15/00 |
| JP | 2005179155 | A | 7/2005 | |
| JP | 2006111478 | A | 4/2006 | |
| JP | 2006117512 | A | 5/2006 | |
| JP | 2009542571 | A | 12/2009 | |
| WO | WO 0049207 | | 8/2000 | |
| WO | WO 2005111277 | | 11/2005 | |
| WO | WO 2006011976 | | 2/2006 | |
| WO | WO2006041660 | | 4/2006 | |

OTHER PUBLICATIONS

Katsuno et al. ("Effect of Off orientation of Seed Crystal on Silicon Carbide (SiC) Single Crystal Growth on the (11-20) Surface", Journal of Electronic Materials, vol. 34, No. 1, 2005. pp. 91-95.*

Nakamura et al. "Ultrahigh-quality Silicon Carbide Single Crystals" LEtters to Nature, vol. 430, Aug. 2004., pp. 1009-1012.*

Tsuchida et al. "Homoepitaxial Growth and Characterization of Thick SiC layers with a Reduced Micropipe Density", Materials Research Cociety Symposium and Proceedings, vol. 815, 2004, pp. J.2.1.1-J..2.1.12.*

Madar et al., "Defects in sublimation grown SiC bulk crystals", Journal of Physics: Condensed Matter, vol. 14, 2002, pp. 13009-13018.*

"Silicon Carbide Substrates", Cree Materials, Mar. 2003, pp. 1-16.*

Khlebnikov et al., "Off c-Axis Bulk Crystal Growth of Silicon Carbide", Apr. 1, 2001, 2pgs., http://www.sbir.gov/sbirsearch/detail/103631, internet retrieval date of Feb. 25, 2013 . . .*

International Search Report of foreign counterpart application PCT/US2007/069946 mailed Nov. 23, 2007; 4 pages.

Muller, et al., "Progress in the industrial production of SiC substrates for semiconductor devices," Materials Science and Engineering B, Elsevier Sequoia, Lausanne, CH, vol. 80, No. 1-3, Mar. 22, 2001, pp. 327-331.

Cree, "Silicon Carbide Substrates and Epitaxy—Product Catalogue," Internet Article retrieved Nov. 1, 2007 from URL: http://www.cree.com/products/pdf/mat-catalog.00g.pdf; pp. 4,9.

Aniken et al., "Progress in SiC Bulk Growth," Materials Science Forum, vols. 338-342, (2000) Trans Tech Publications, pp. 13-16.

Dedulle et al., "Free growth of 4H-SiC by sublimation method," Materials Science Forum, vols. 457-460 (2004) Trans Tech Publications, pp. 71-74.

Nakamura et al., "Surface Mechanisms in Homoepitaxial Growth on a-SiC {001}-vicinal faces," Materials Science Forum, vols. 457-460 (2004) Trans Tech Publications, pp. 163-168.

Rost, et al., "Macrodefect Generation in SiC Single Crystals Caused by Polytype Changes," Materials Science Forum, vols. 389-393 (2002) Trans Tech Publications, pp. 67-70.

Gupta, et al., "6H and 4H-SiC Bulk Growth by PVT and Advanced PVT (APVT)," Materials Res. Soc. Symp. Proc. vol. 815, 2004 Materials Research Society, pp. J5.24.1-J5.24.6.

Cree, Inc. English translation of Russian Office Action, dated Mar. 11, 2010.

Cree, Inc., Chinese Patent Application No. 200780025613.9, Office Action dated Oct. 10, 2011.

Cree, Inc., Japanese Patent Application No. 2009-518424, Office Action dated Nov. 18, 2011.

Cree, Inc., Chinese Patent Application No. 200780025613.9, Office Action, Nov. 5, 2012.

Cree, Inc., Japanese Patent Application No. 2009-518424, Decision of Rejection dated Jun. 15, 2012.

Cree, Inc., European Patent Application No. 07797873.2-1353, Office Action, Jul. 9, 2013.

Cree, Inc., Japanese Patent Application No. 2009-518424, Office Action, Jul. 30, 2013.

Cree, Inc., European Patent Application No. 07797873.2-1215, Office Action, Aug. 1, 2012.

Cree, Inc., Japanese Application No. 2009-518424, Decision of Appeal, Feb. 18, 2014.

Cree, Inc., Japanese Application No. 2009-518424, Redacted letter from Japanese agent regarding Decision of Appeal, Apr. 18, 2014.

Ohtani, N., et al., Comparative Study of SiC Bulk Crystal Growth Parallel and Perpendicular to the <0001> c-axis, 2000, pp. 16-23, FED, vol. 11, No. 2.

Cree, Inc., Japanese Patent Application No. 2012-228190, Office Action, Dec. 6, 2013.

Cree, Inc., European Application No. 07797873.2, Office Action, Aug. 5, 2014.

Cree, Inc., Japanese Application No. 2012-228190, Office Action, Sep. 12, 2014.

* cited by examiner

ONE HUNDRED MILLIMETER SIC CRYSTAL GROWN ON OFF-AXIS SEED

BACKGROUND

The present invention relates to semiconductor materials and in particular relates to the growth of very high crystal quality (e.g., low defect) large-diameter single crystals of silicon carbide (SiC).

The electronic properties of semiconductors stem directly from their physical properties, including their crystal structure. Defects in a crystal structure, when present in large enough concentration, may impair the desirable physical and electronic properties of a semiconductor material. Some defects exhibit problems immediately, while others become evident over periods of continued use.

All crystals include some structural defects. Indeed to some extent, the existence of defects provides the basis for crystal growth because the edges of certain defects may under certain conditions provide the best opportunity for continued ordered growth. Thus, the relevant inquiry for semiconductor materials and their application to electronic devices becomes the concentration of such defects (typically expressed as the number of defects per unit area) and their character rather than their basic presence or absence. As used herein, the term "defects" means defects in a crystal structure or structural defects, and does not include impurity elements such as dopants that may be intentionally or unintentionally introduced into a crystal structure.

Silicon carbide has a number of properties that make it an advantageous semiconductor material. Physically, the material is very hard and has an extremely high melting point, giving it robust physical characteristics. Chemically, silicon carbide is highly resistant to chemical attack and thus offers chemical stability as well as thermal stability. Perhaps most importantly, however, silicon carbide has excellent electronic properties, including high breakdown field, a relatively wide band gap (about 3.2 eV at room temperature for the 4H polytype), and a high saturated electron drift velocity. These properties give SiC significant advantages with respect to high power operation, high temperature operation, and radiation hardness.

In its crystal forms, however, silicon carbide can exist in over 150 polytypes (or crystal structures), many of which are separated by relatively small thermodynamic differences. Thus, maintaining a single polytype while growing a large SiC crystal represents a fundamental challenge. Additionally, silicon carbide tends to sublime rather than melt at high temperatures (that is, SiC tends to transition directly from the solid phase to the gas phase as its temperature is increased). The vapor phase species ($Si_{(g)}$, $SiC_{2(g)}$ and $Si_2C_{(g)}$) that result from sublimation also raise difficulties in polytype control. As another factor, SiC tends to sublime in non-stoichiometric fashion and to leave behind solid carbon.

Thus, certain of silicon carbide's physical and chemical properties can cause difficulties during silicon carbide growth, particularly growth in sizes, amounts, and purities that are useful for commercial production of wafers, wafers with epitaxial layers, and commercially viable quantities of electronic devices.

The first step in semiconductor device manufacturing typically comprises forming the thin layers of semiconductor material which will ultimately constitute the device. In many applications, this takes the form of growing one or more epitaxial layers ("epilayers") of semiconductor material on a large, "bulk" substrate crystal of the same or different semiconductor material. Epitaxial layers may be formed with extremely high quality using very precise, well-understood techniques such as chemical vapor deposition (CVD), molecular beam epitaxy (MBE) and other methods. In general, growth of high quality, epitaxial layers requires relatively slow growth rates. Bulk crystals suitable for use as a substrate are typically grown at a relatively fast rate, but usually at somewhat lower quality than epitaxial layers. Nevertheless, because an epitaxial layer fundamentally repeats the atomic pattern of the substrate on which the epitaxial layer is formed, higher quality substrates are both desirable and necessary for producing higher quality epilayers.

In the silicon carbide art, epilayer growth on a silicon carbide substrate may be enhanced by growing the epilayer in an "off-axis" orientation. The term "off-axis" is best understood by comparison to "on-axis" growth. On-axis growth refers to crystal growth that takes place in a direction that proceeds perpendicular to one of the defined faces of the silicon carbide crystal. The growth direction is given in well-understood crystal Miller-Bravais notation such as [defg] in which the brackets indicate that a direction is being given and the integers represent a vector projection along imaginary crystal axes. When the Miller index is given in parentheses, the notation refers to a plane. Thus, the normal (perpendicular) direction to the silicon face of silicon carbide is designated [0001] for the hexagonal (e.g. 6H, 4H) polytypes of silicon carbide, while the silicon face itself is designated the (0001) plane.

The [0001] direction is referred to as the c-axis, while the plane that is normal to the c-axis is called a c-face, c-plane or a basal plane. The c-plane is sometimes referred to as "the" basal plane.

FIG. 6 illustrates a unit cell for a simple hexagonal crystal structure. The c-face and c-axis are indicated on the drawing. The [0001] direction and its opposite, the [000$\bar{1}$] direction are also indicated on FIG. 6. The [0001] direction and the [000$\bar{1}$] direction are considered equivalent directions, in that the orientation of the crystal is arbitrary. Equivalent directions are indicated by the use of angled brackets. Accordingly, the notation <0001> refers to the family of directions equivalent to the [0001] direction. Families of planes are designated by brackets; e.g. {0001}. One side of a SiC wafer is terminated by silicon atoms and the other side by carbon atoms. By convention, the silicon side is denoted (0001) and the carbon side is denoted (000$\bar{1}$). Depending upon convention and typesetting, the "bar" designation may also precede the relevant integer; i.e. (000-1).

The term off-axis refers to growth in a direction other than directly perpendicular to a crystal face and is typically slightly oblique in relation to the c-axis which is normal to the crystal's c-face. These off axis directions are considered vicinal, being directions deviating slightly from the fundamental directions or planes. Off-axis growth may reduce random nucleation and thus encourage silicon carbide epilayers to grow with greater lattice accuracy. This is understood as resulting from the greater number of "steps" that are exposed on an off-axis face in comparison to an on-axis face. In a particular example, an 8° orientation from the <000$\bar{1}$> direction toward either the <11$\bar{2}$0> or <10$\bar{1}$0> direction has been found to be particularly effective for encouraging high-quality silicon carbide epitaxial growth.

An exemplary off-axis epitaxial growth method is set forth in U.S. Pat. No. 4,912,064 which is incorporated entirely herein by reference. In preparing substrates for such growth, a larger crystal or "boule" of on-axis bulk silicon carbide is cut at the desired angle (e.g., 8°) to provide the off-axis face, and usually a number of bulk wafers cut at the appropriate angle.

Nevertheless, slicing on-axis grown crystals of SiC at an 8° angle to create off-axis wafers is notably wasteful; i.e. a wedge-shaped portion of the boule must be discarded from both top and bottom in order to provide the 8° off axis substrates for epilayer growth.

Substrate growth commonly takes place in a seeded sublimation growth method and system as set forth in commonly assigned U.S. Pat. No. 4,866,005 and its Reissue No. RE34, 861, the contents of both of which are incorporated entirely herein by reference. The nature of sublimation growth is such that the direction of boule growth is primarily determined by the thermal gradient between the source (usually, but not necessarily, SiC powder) and the seed. Thus, a seeded crystal with an 8° off-axis surface will grow in the direction of the thermal gradient (with the powder warmer than the seed).

One of the limitations to date in advancing the use of silicon carbide is a size factor. By way of comparison, in other semiconductor materials such as silicon (Si) and gallium arsenide GaAs), six inch diameter wafers are common and some silicon wafers are available with diameters as 300 millimeters (mm).

In contrast, the physical growth challenges provided by silicon carbide are such that two and three inch wafers (50.8 mm and 76.2 mm) are considered commercially typical, while wafers 100 mm or larger are not widely available. Recent work in silicon carbide growth confirms these typical sizes. For example, Dedulle et al., *Free Growth Of 4H-SiC By Sublimation Method*, MATERIALS SCIENCE FORUM Vol. 457-460 (2004) pages 71-74 report growth of 25 millimeter and 45 millimeter diameter crystals. Nakamura, et al, id at pages 163-168, carried out epitaxial growth on commercially available wafers rather than extending the growth or size of the substrate wafers themselves. Rost, *Macrodefect Generation in SiC Single Crystals Caused by Polytype Changes*, MATERIALS SCIENCE FORUM VOL. 389-393 (2002) pages 67-70, likewise refer to 35 mm single crystals. Anikin, *Progress in SiC Bulk Growth*, MATERIALS SCIENCE FORUM, VOL. 338-342 (2000) pp 13-16 report 30 millimeter diameter crystals. Gupta et al., *6H and 4H-SiC Bulk Growth by PVT and Advanced PVT (APVT)*, MAT. RES. SOC. SYMP. PROC. VOL. 815 (2004) report the use of 2 inch and 3 inch silicon carbide substrates.

The area of a circle (typical semiconductor wafers are circular with defined "flat" edge portions for standardization and alignment purposes) is, of course, directly proportional to the square of its radius. Thus, increasing the diameter of appropriate SiC seed crystals, bulk crystals grown on seed crystals, and wafers cut from bulk crystals, potentially offers geometric, rather than merely marginal, advantages provided that appropriate minimal defect concentrations (i.e., high quality) can be preserved. For example, a 45 mm diameter wafer has an area of about 1590 mm$^2$; while a 90 mm wafer (i.e., twice the diameter) would have an area of about 6360 mm$^2$.

In conventional techniques for obtaining off-axis wafers, a larger crystal is typically oriented away from the crystal normal following which wafers are cut against the orientation to produce the off-axis seed. Orienting the crystal away from the normal reduces the effective thickness available to cut wafers of the same size as the crystal. The effective loss can be estimated by the wafer size (diameter) and the tangent of the cut angle. For example, for an eight degree (8°) off-axis cut on a 100 millimeter diameter crystal, the tangent of 8° (0.1405) defines a loss of nearly 14 millimeters of material.

SUMMARY

In one aspect the invention is a semiconductor crystal. The crystal comprises a seed portion and a growth portion on the seed portion. The seed portion and the growth portion form a substantially right cylindrical single crystal of silicon carbide. A seed face defines a interface between the growth portion and the seed portion, with the seed face being substantially parallel to the bases of the right cylindrical crystal and being between about 0.5° and 12° off-axis with respect to a {0001} plane of the single crystal. The growth portion replicates the polytype of the seed portion and the growth portion has a diameter of at least about 100 mm.

In another aspect the invention is a semiconductor crystal comprising a single crystal seed portion and a single crystal growth portion on the seed portion in which the seed portion and the growth portion have a diameter sufficient to define at least a 100 millimeter diameter right cylindrical single crystal of silicon carbide. A seed face defines an interface between the growth portion and the seed portion with the seed face being substantially parallel to the bases of the right cylindrical crystal and being between about 0.5° and 12° off-axis with respect to a {0001} plane of the single crystal. The growth portion replicates the polytype of the seed portion.

In another aspect the invention is a semiconductor wafer comprising a single polytype of silicon carbide with a diameter of at least 100 millimeters and a micropipe density of less than 100 cm$^{-2}$.

In yet another aspect the invention is a method for growing high quality large diameter single crystals of silicon carbide. The method comprises cutting a seed crystal of silicon carbide from a bulk single crystal of silicon carbide at an angle with respect to the c-axis of the bulk crystal that produces a seed crystal with a face that is off-axis with respect to the c-face of the bulk crystal, applying a predominant thermal gradient to the off-axis seed crystal in a seeded growth system in a direction that is perpendicular to the seed face of the seed crystal and non-perpendicular with respect to the c-face until a bulk crystal of desired size is obtained, and cutting an off-axis wafer from the bulk crystal by cutting the bulk crystal parallel to the original face of the seed crystal to produce a seed wafer with a face that is off-axis with respect to the c-axis of the seed wafer.

The foregoing and other objects and advantages of the invention and the manner in which the same are accomplished will become clearer based on the followed detailed description taken in conjunction with the accompanying drawings.

DETAILED DESCRIPTION

Figure 1:
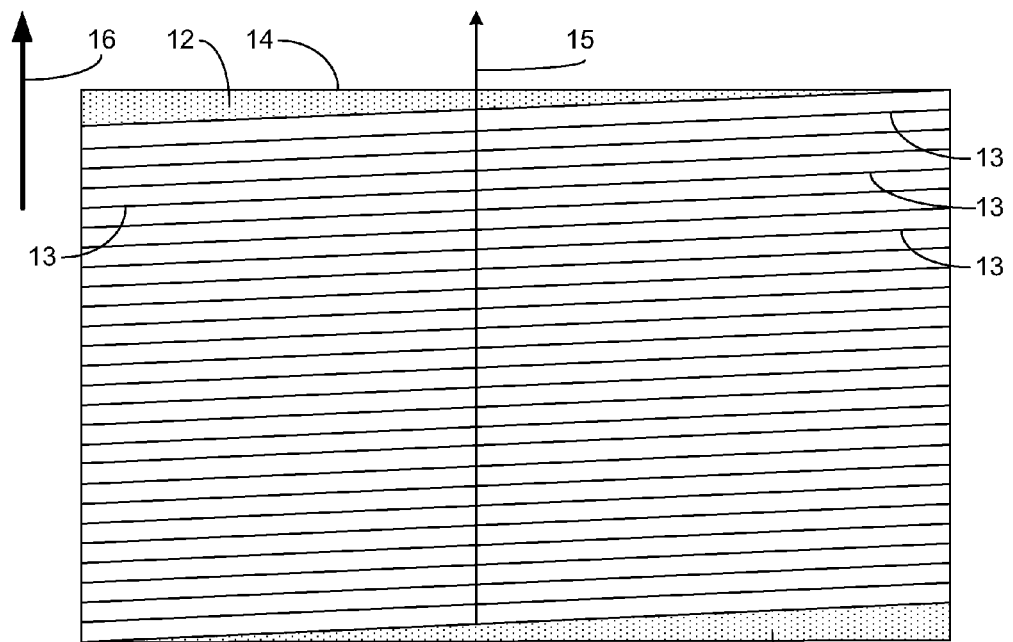
FIG. 1 is a schematic view of a bulk crystal according to the conventional prior art.

FIG. 1 is a schematic diagram of a conventional technique for obtaining off-axis silicon carbide wafers. In general, a bulk crystal broadly designated at 10 is grown in an on-axis orientation. FIG. 1 accordingly illustrates that the c-axis [0001] 15 is perpendicular to the c-face (0001) 14 of the crystal 10. In order to obtain off-axis seeds for off-axis growth, the crystal 10 is cut along a plurality of lines 13 that are non-perpendicular (off-axis) to the c-axis 15 and thus are non-parallel with respect to the c-face 14.

As noted in the background, certain problems result. First, cutting the crystal 10 in this manner defines respective waste portions 12 at both the bottom and top of the crystal 10. The greater the degree to which the desired cuts 13 (which thus define faces) are off-axis, the greater the amount of material that will be wasted.

Second, in accordance with basic principles of solid and plane geometry, if the crystal 10 is in the form of a cylinder, then cutting a plane at an angle other than parallel to the faces produces an ellipse-shaped slice rather than a circular one. Although this is not a problem with respect to microscopic growth of silicon carbide, in a macroscopic sense, seeds and wafers are conventionally circular (with orthogonal flats in defined locations) and thus the ellipse-shaped slices must be either handled in some customized fashion or trimmed into a conventional shape.

Figure 2:
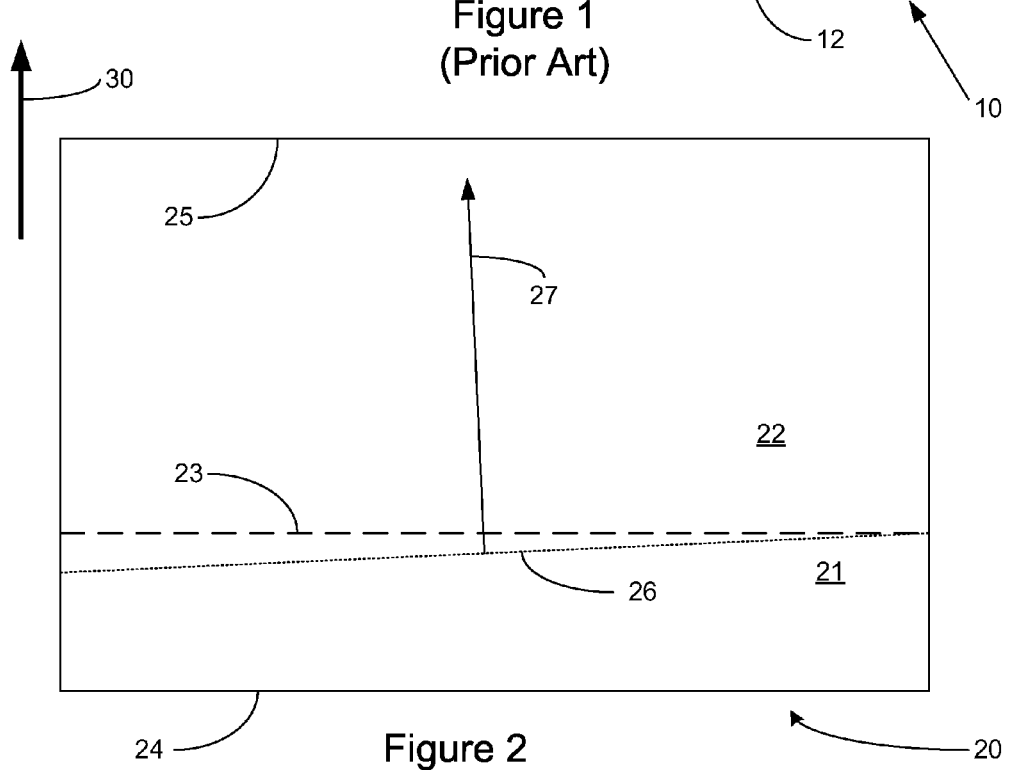
FIG. 2 is a schematic diagram of a crystal according to the present invention.

FIG. 2 is a schematic illustration of a first embodiment of a crystal, broadly designated at 20, according to the present invention. The crystal 20 includes a seed portion 21 and a growth portion 22 on the seed portion 21. The seed portion 21 and the growth portion 22 together form a substantially right cylindrical single crystal of silicon carbide. The seed face 23 defines an interface between the growth portion 22 and the seed portion 21. In actual practice and as recognized by persons skilled in this art, in a grown crystal, the seed face 23 may be historical rather than observable. The seed face 23 is substantially parallel to the bases 24 and 25 of the right cylindrical crystal 20 and is between about 0.5 and 12 degrees off axis with respect to the c-face of the single crystal 20. The (0001) c-face is, of course, a member of the family of {0001} planes. The growth portion 22 replicates the polytype of the seed portion 21 and the growth portion 22 has a diameter of at least about 100 millimeters.

The degree to which the orientation is off angle is not limited by a numerical value per se, but rather by logical functional considerations. For example, and to exaggerate, growing on an "off axis" angle of 90° essentially means growing on a different crystal face. Similarly, using an off axis orientation close to 0° offers the least difference from the basal plane itself. Thus, it will be understood that although successful growth has been demonstrated at off axis orientations of up to 8°, success at larger angles is likewise expected and 8° does not represent an absolute upper limit for the invention.

FIG. 2 also illustrates the c-axis 27 of the crystal 20 and likewise illustrates the thermal gradient 30 that drives the growth direction of the crystal during sublimation. As well understood in this art, the thermal gradient represents a desired temperature difference across a physical distance; e.g. degrees centigrade per centimeter. Generally speaking, in the presence of a thermal gradient, sublimed (and other gaseous) species will migrate from a warmer location to a (relatively) cooler one. Accordingly, controlling the thermal gradients in a crystal growth system is a significant factor in controlling the nature and direction of crystal growth. In the figures herein, the respective arrows (16, 30, 60) schematically represent axial thermal gradients.

FIG. 2 accordingly illustrates that in contrast to the crystal illustrated in FIG. 1, growth does not occur normal to the c-face 26, but instead is normal to the seed face 23. In a corresponding manner, the thermal gradient 30 and the c-axis 27 are no longer parallel to one another nor are they intended to be parallel to one another.

The seed portion 21 and the growth portion 22 typically have a polytype selected from the group consisting of the 3C, 4H, 6H and 15R polytypes of silicon carbide with the 4H polytype being particularly (but not exclusively) beneficial for high frequency, high power devices. Similarly, both the 4H and 6H polytypes are particularly beneficial for high temperature devices, optoelectronic devices and deposition of Group III nitride materials. It will be understood that these are favorable in a relative sense with respect to one another and that the invention provides advantages regardless of the polytype of the single crystal.

The degree to which the seed face is off-axis with respect to the c-face is to some extent a matter of design choice, typically ranging between 0.5° and 12°, but has been used at about 3.50 for 6H and at about 80 off-axis for 4H, both expressed with respect to the c-face.

Figure 3:
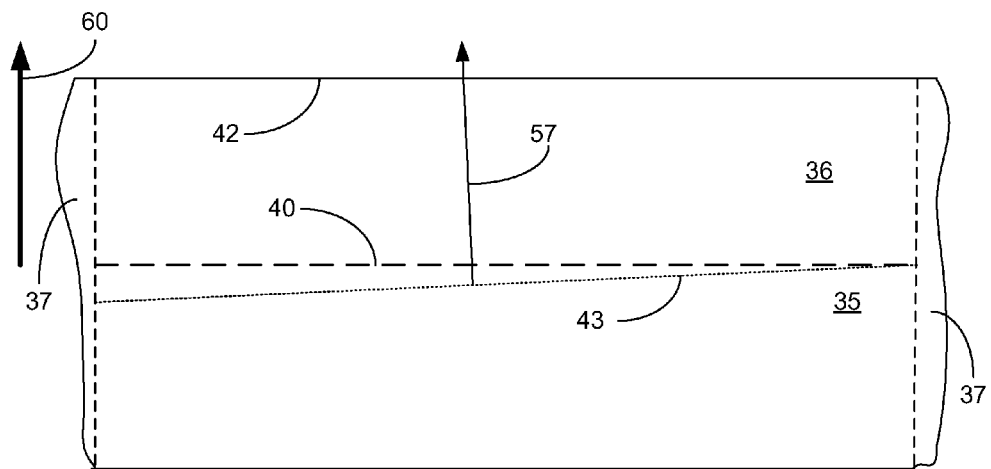
FIG. 3 is a schematic diagram of another embodiment of a crystal according to the present invention.
Figure 4:
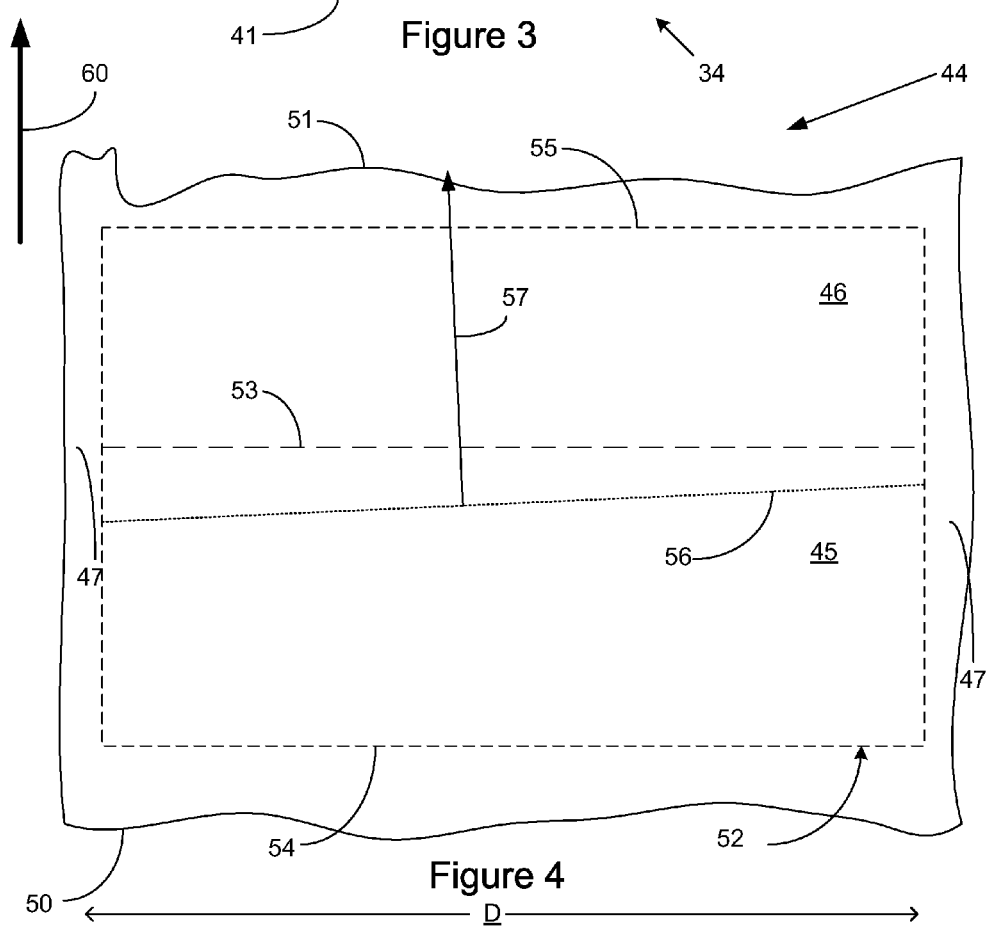
FIG. 4 is a schematic diagram of another embodiment of a crystal according to the present invention.

FIGS. 3 and 4 illustrate additional embodiments of the present invention. In particular, the nature of seeded silicon carbide growth, including sublimation growth, is such that even under the best conditions, some as-grown crystals may demonstrate at least edges that are irregular and potentially include non-single polytype material, and in some cases one or more surfaces may be non-planar, sometimes depending upon the manner in which they are physically mounted to or removed from a growth system.

Accordingly, FIG. 3 illustrates a semiconductor crystal broadly designated at 34 that includes a single crystal seed portion 35 and a single crystal growth portion 36 on the seed portion 35, with the seed portion 35 and the growth portion 36 having the same polytype. The crystal 34 also includes edge portions schematically illustrated at 37 that can include other polytypes (i.e., different from the seed and growth portions), or polycrystalline material that is inconsistent with the single crystal material often desired for many electronic applications.

The seed portion and the growth portion 36 are nevertheless of a sufficient diameter to define at least a 100 millimeter diameter right cylindrical single crystal of silicon carbide independent of any of the different polytype material. As in the previous embodiment, a seed face 40 defines a interface between the growth portion 36 and the seed portion 35 with the seed face 40 being substantially parallel to the bases 41 and 42 of the right cylindrical crystal 34 and being between about 0.5 and 12° degrees off-axis with respect to the c-face 43 of the single crystal 34. As in the other embodiments, the growth portion 36 replicates the polytype of the seed portion 35.

FIG. 3 also illustrates the c-axis 57 and the direction of an applied thermal gradient 60 illustrating the same points as raised with respect to the earlier embodiments.

FIG. 4 illustrates another crystal 44 according to the present invention that includes a seed portion 45 and a growth portion 46 and edge portions 47 of non-single crystal material along with surfaces 50 and 51 that may be non-planar. The causes of such non-planar surfaces such as 50 and 51 are variable, but do not necessarily preclude single crystals. Thus, the seed portion 45 and the growth portion 46 have a diameter "D" sufficient to define at least a 100 millimeter right cylindrical single crystal 52 of silicon carbide within the overall crystal 44.

As in the other embodiments, FIG. 4 illustrates a seed face 53 defining the interface between the growth portion 46 and the seed portion 45 with the seed face 53 being substantially parallel to the bases 54 and 55 of the right cylindrical crystal portion 52. The seed face 53 is again between about 0.5° and 12° degrees off-axis with respect to the c-face 56 of the single crystal 52. As in the other embodiments, the growth portion 46 replicates the polytype of the seed portion 45.

Figure 5:
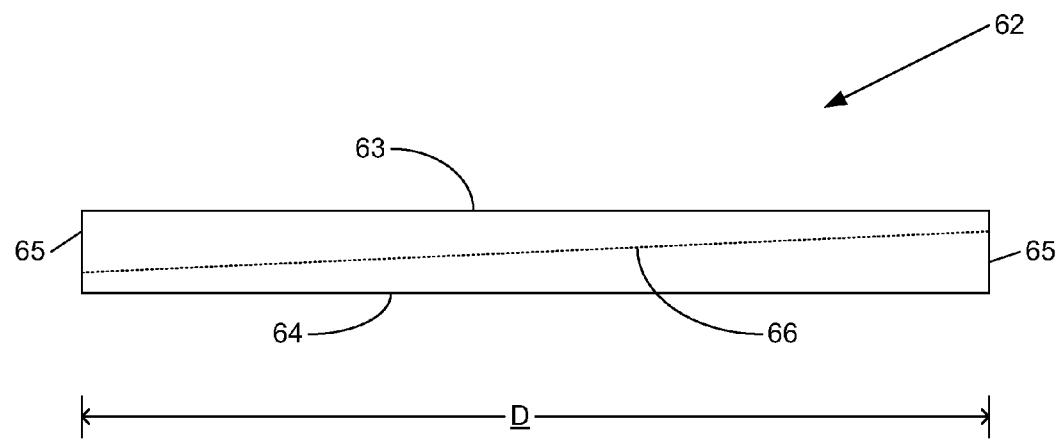
FIG. 5 is a schematic view of a wafer according to the present invention.

In yet another embodiment, and as illustrated in FIG. 5, the invention comprises a semiconductor wafer 62 having a diameter "D" of at least 100 millimeters consistent with normal standards for wafer or diameter measurement as discussed in various sources (e.g. http://www.cree.com/products/pdf/MAT-CATALOG.00G.pdf [online] (April 2006)). The wafer 62 includes substantially parallel faces 63 and 64 and a circumferential edge 65 that is substantially perpendicular to the faces 63 and 64. The wafer is characterized in that the c-face 66 of the single crystal that forms the wafer is between about 0.5° and 12° degrees off axis with respect to the bases 63 and 64 of the single crystal wafer 62.

In wafer form, the 100 mm single crystal is suitable for conventional materials handling and handling equipment. In wafer form the crystal also can serve as a substrate for epitaxial growth of silicon carbide or other materials, particularly Group III nitrides for optoelectronic devices such as blue-emitting light emitting diodes, and blue laser diodes.

Thus, in another aspect, the invention is a combination of a wafer according to the present invention and epitaxial layers formed on the wafer. The wafers with epitaxial layers offer numerous advantages (typically as precursors). For example, the wafers and epilayers can form the basis for metal semiconductor field effect transistors (MESFETs) and related devices. Single crystal wafers according to the invention provide a close lattice match with both silicon carbide and Group III nitrides. The wafers have silicon carbide's high thermal conductivity offering greater power handling and improved reliability. The use of Group III nitride epilayers on SiC substrates offers a favorable approach for short wavelength laser diodes that can significantly increase optical storage capacities in comparison to longer wavelength diodes. As another advantage, silicon carbide can be formed with electrical conductivity ranging from insulating for microwave devices (e.g. U.S. Pat. No. 6,316,793) to conducting for a light emitting diodes (e.g. U.S. Pat. No. 4,918,497) and lasers (e.g. U.S. Pat. No. 5,592,501).

Crystals and wafers according to the present invention have a micropipe density less than 100 per square centimeter ($cm^{-2}$) in all embodiments, in some embodiments less than 30 $cm^{-2}$, in some embodiments less than 15 $cm^{-2}$, and in some embodiments 5 $cm^{-2}$ or less.

The crystals and wafers according to the present invention can also be categorized using other criteria for describing quality. Some of these criteria can be described in one or more of the following terms.

"(Area) contamination" refers to any foreign matter on the surface in localized areas that is revealed under high-intensity or diffuse illumination as discolored, mottled, or cloudy in appearance resulting from smudges, stains, or water spots.

"Cracks" refer to a fracture or cleavage of the wafer that extends from the front side of the wafer to the back side surface of the wafer. For quality description purposes a "crack" must exceed 0.010 inch in length under high-intensity illumination. This helps discriminate fracture lines from allowable crystalline striations. Such fracture lines typically exhibit sharp thin lines of propagation which discriminate them from striations.

"Edge chips" refers to any edge anomaly (including wafer saw exit marks) in excess of 1.5 millimeters in either radial depth or width. As viewed under diffuse illumination, edge chips are determined as unintentionally missing material from the edge of the wafer.

"Edge exclusion" refers to a defined outer annulus of the wafer which is designated as a wafer handling area and is excluded from surface finish criteria.

"Hex plates" are hexagonal shaped platelets on the surface of the wafer that appear silver in color to the unaided eye under diffuse illumination.

"Masking defects" ("Mounds") refer to distinct areas raised above the wafer front side surface as viewed with diffuse illumination.

"Orange peel" refers to visually detectable surface roughening when viewed under diffuse illumination.

"Pit" refers to an individual distinguishable surface anomaly which appears as a depression in the wafer surface with a length and width ratio no less than 5 to 1 and that is visible under high intensity illumination.

"Foreign polytypes" ("inclusions," or "crystallites")" refer to regions of the wafer crystallography that are polycrystalline or are other different polytype material than the remainder of the wafer (e.g., 4H mixed in with 6H). Poly regions frequently exhibit color changes or distinct boundary lines and are judged in terms of area percent under diffuse illumination.

"Scratches" are defined as singular cuts or grooves into the front side wafer surface with a length to width ratio of greater than 5 to 1, and visible under high intensity illumination.

"Striations" are defined as linear crystallographic defects extending down from the surface of the wafer which may or may not pass through the entire thickness of the wafer and generally follow crystallographic planes over their length.

"Total usable area" refers to a cumulative subtraction of all noted defect areas from the front side wafer quality area within the edge exclusion zone. The remaining percent value indicates the proportion of the front side surface to be free of all noted defects (not including the two millimeter to edge exclusion).

With these criteria as background, wafers according to the present invention demonstrate edge chips in a concentration of less than two per wafer. Wafers according to the invention demonstrate orange peel or pits of no more than 30 percent of the wafer area and in some embodiments no more than 10 percent of the wafer area.

Wafers according to the invention demonstrates striation of 20 or less per wafer and in other embodiments 3 or less per wafer. Wafers according to the invention are free of area contamination or cracks. The concentration of hexagonal plates is less than 30 percent of the cumulative area of the wafer and in other embodiments less than 10 percent of the cumulative area of the wafer.

Wafers according to the invention have no more than eight scratches or in some embodiments no more than five scratches.

Wafers according to the invention are inspected for masking defects (mounds) under a 200× microscope. In all embodiments the wafers have 10 or fewer defects in 3 or less of the 9 fields inspected in a cross pattern, or in other embodiments 10 or fewer defects in 5 or less of the 9 fields inspected in a cross pattern. The wafers are free of contamination. Expressed as a cumulative total, the cumulative area defects are 30 percent or less of the wafer area, and in some embodiments 10 percent or less of the wafer area.

In another aspect, the invention is a method for growing high quality large diameter single crystals of silicon carbide. In this aspect, the invention comprises cutting a seed crystal of silicon carbide from a bulk single crystal of silicon carbide at an angle with respect to the c-axis of the bulk crystal that produces a seed crystal with a face that is off-axis with respect to the c-face of the bulk crystal, applying a predominant thermal gradient to the off-axis seed crystal in a seeded growth system in a direction that is perpendicular to the seed face of the seed crystal and non-perpendicular with respect to the c-face until a bulk crystal of desired size is obtained, and cutting an off-axis wafer from the bulk crystal by cutting the bulk crystal parallel to the original face of the seed crystal to produce a seed wafer with a face that is off-axis with respect to the c-axis of the seed wafer.

In particular, the method typically comprises cutting a plurality of wafers from the bulk crystal.

As noted with respect to other aspects of the invention, the resulting wafer provides an appropriate seed for seeding a bulk growth system with the cut, off-axis wafer. Bulk growth of silicon carbide can then be carried out in such a seeded system.

The method can further comprise growing at least one, and potentially a plurality, of epitaxial layers on the off-axis face of the seed wafer, with epitaxial layers of silicon carbide and of Group III nitride material being particularly advantageous.

Figure 7:
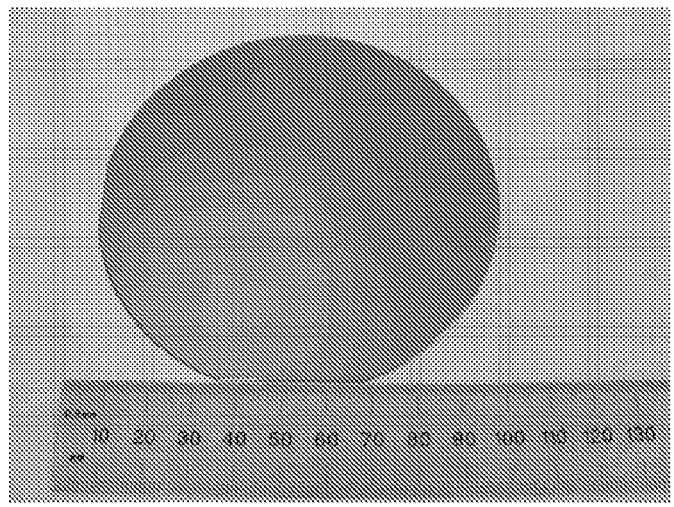
FIG. 7 is a set of three photographs of the high quality surface of a wafer formed according to the present invention.
Figure 7:
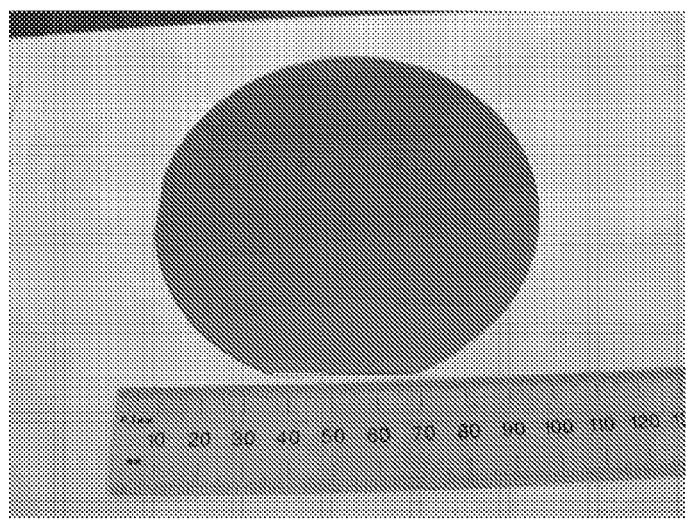
Figure 7:
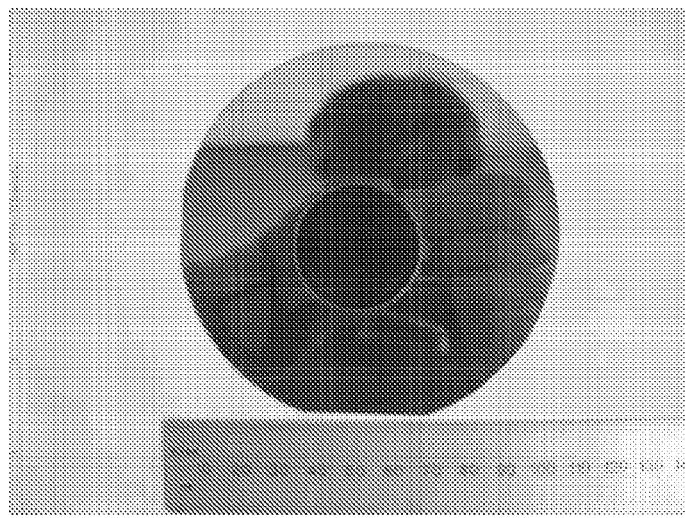

FIG. 7 is a set of three photographs of a silicon carbide wafer formed according to the present invention. FIGS. 7(A) and 7(B) are taken at a slight non-perpendicular angle and thus the wafer appears elliptical in the photograph. The wafer is circular, however, as illustrated by the head-on photograph of FIG. 7(C). These photographs demonstrate the 100 mm wafers produced according to the present invention.

Figure 8:
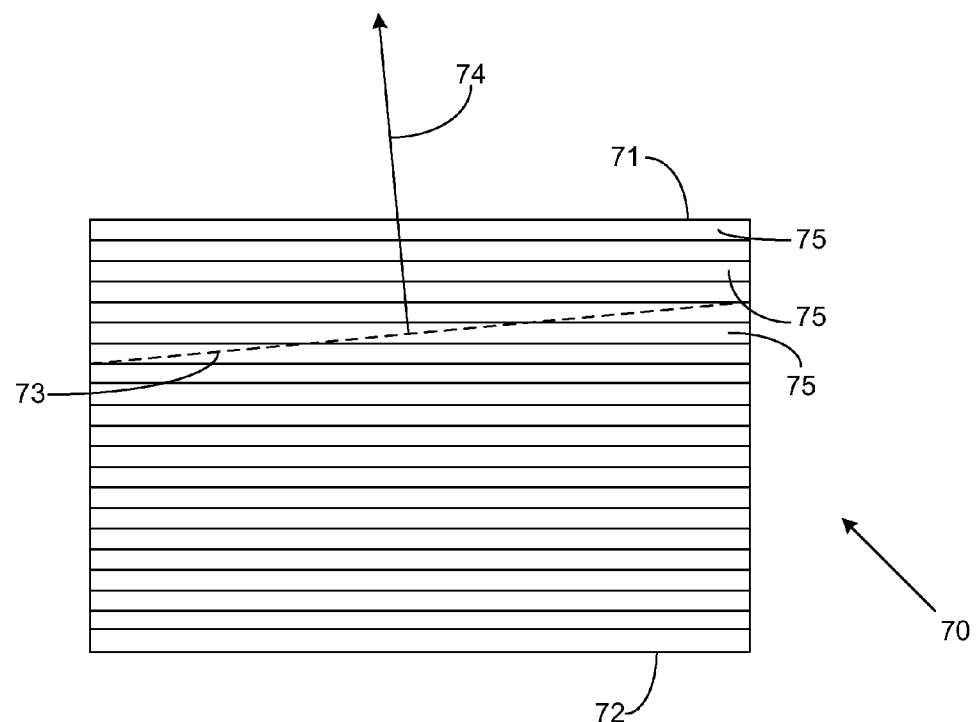
FIG. 8 is a schematic view of a bulk crystal according to the present invention.
Figure 6:
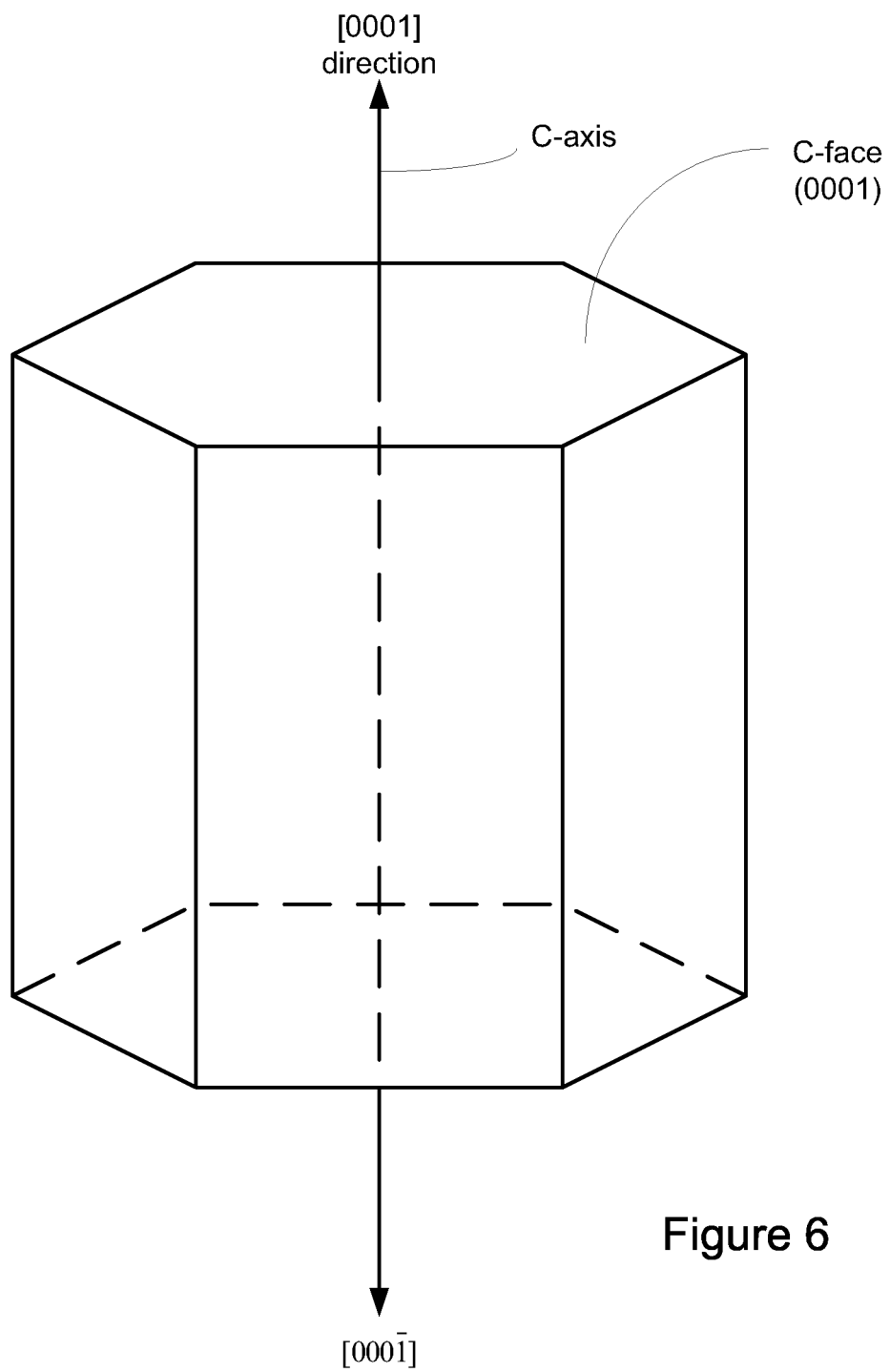
FIG. 6 is a schematic diagram of certain aspects of hexagonal crystal geometry.

FIG. 8 is a schematic diagram illustrating aspects of the method and its advantages. FIG. 8 illustrates a bulk crystal broadly designated at 70 in which the opposite faces 71 and 72 are off-axis with respect to the c-face 73. For reference purposes, the c-axis 74 is also shown. For clarity's sake, FIG. 8 exaggerates the extent of off-axis orientation.

Consistent with the method, because the faces 71, 72 of the grown crystal are already off-axis with respect to the c-face of the crystal, and assuming that the crystal 70 is grown (as is typical) in the form of a solid right cylinder, the crystal 70 can be cut perpendicular to its cylindrical axis to define individual wafers 75 with off-axis surfaces and in the form of circles rather than ellipses.

It will be understood that although the techniques described herein have been described with respect to the (0001) face and the [0001] axis of SiC, the techniques can be incorporated using other faces (e.g., the {0001} planes) and with respect to other axes. For a number of reasons, the (0001) and (000$\bar{1}$) faces are convenient for bulk growth of silicon carbide, but not exclusively so. Thus, persons of skill in this art will be able to incorporate the claimed invention using angles and faces in addition to those described herein.

It will also be understood by those familiar with the growth of silicon carbide crystals that the term "single crystal" can be used to describe large boule crystals that have some mosaic character. As further known to those skilled in the art, crystals with mosaic character are grown with multiple nucleating regions that grow together to form a single crystal. The resulting regions may be bounded by dislocations or other defects, but still have single crystal characteristics when analyzed with well-understood techniques, particularly X-ray diffraction. The aggregate of these regions may have a mosaic structure with very small tilt regions between the grains, but the regions still grow together to form the single crystal.

In terms of X-ray diffraction, the single crystal characteristics of crystals grown according to the present invention will have an angular spread from the diffraction angle of between about 36 and 180 arc seconds. This is well within the normal range of single crystal tolerance in the art in which an angular spread of 40-60 arc seconds ($sec^{-1}$) represents a high-quality single crystal. The angular spread is measured as full width at half maximum (FWHM) at the Bragg angle consistent with well understood standards in this art.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. An off-axis single crystal silicon carbide wafer made by a method of:
    cutting a seed crystal of silicon carbide from a bulk single crystal of silicon carbide at an angle with respect to the c-axis of the bulk crystal to produce a seed crystal with a seed face that is off-axis with respect to the c-face of the bulk crystal;
    applying a thermal gradient to the seed crystal in a seeded growth system in a direction that is perpendicular to the seed face of the seed crystal and non-perpendicular with respect to the c-face of the seed crystal to produce a right cylindrical crystal that is between 0.5° and 12° of axis with respect to the c-face and that is at least 100 mm in diameter; and
    cutting the off-axis single crystal silicon carbide wafer from the right cylindrical crystal by cutting the right cylindrical crystal perpendicular to the right cylindrical crystal to produce the off-axis single crystal silicon carbide wafer;
    wherein the off-axis single crystal silicon carbide wafer has circular, substantially parallel faces that are between about 0.5° and 12° off-axis with respect to a {0001} plane and that have at least a 100 millimeter diameter, a circumferential edge that is perpendicular to the circular, substantially parallel faces, a surface micropipe density between 1 $cm^{-2}$ and 100 $cm^{-2}$, a dopant, and less than two edge chips.

2. The off-axis, single crystal, silicon carbide wafer according to claim 1 having a polytype selected from the group consisting of the 2H, 3C, 4H, 6H and 15R polytypes of silicon carbide.

3. The off-axis, single crystal, silicon carbide wafer according to claim 1 wherein a polytype is selected from the group consisting of 4H and 6H.

4. The off-axis, single crystal, silicon carbide wafer according to claim 1 wherein said face is off-axis towards <11$\bar{2}$0>.

5. The off-axis, single crystal, silicon carbide wafer according to claim 1 wherein said face is off-axis towards <10$\bar{1}$0>.

6. The off-axis, single crystal, silicon carbide wafer according to claim 1 further comprising at least one epitaxial layer of semiconductor material.

7. The off-axis, single crystal, silicon carbide wafer according to claim 6 wherein said epitaxial layer comprises silicon carbide.

8. The off-axis, single crystal, silicon carbide wafer according to claim 6 wherein said epitaxial layer comprises a Group III nitride.

9. The off-axis, single crystal, silicon carbide wafer according to claim 6 comprising a plurality of epitaxial layers.

10. The off-axis, single crystal, silicon carbide wafer according to claim 1 having a surface micropipe density of less than 20 $cm^{-2}$.

11. The off-axis, single crystal, silicon carbide wafer according to claim 10 having a surface micropipe density of less than 5 $cm^{-2}$.

\* \* \* \* \*